(12) United States Patent
Wang et al.

(10) Patent No.: US 9,775,255 B1
(45) Date of Patent: Sep. 26, 2017

(54) DISPLAY DEVICE AND METHOD FOR MANUFACTURING THE SAME

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Yulin Wang, Beijing (CN); Li Sun, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/236,879

(22) Filed: Aug. 15, 2016

(30) Foreign Application Priority Data

Mar. 7, 2016 (CN) .......................... 2016 1 0127628

(51) Int. Cl.
| H05K 1/00 | (2006.01) |
| H05K 5/00 | (2006.01) |
| H01L 51/00 | (2006.01) |
| H05K 1/02 | (2006.01) |
| H05K 3/00 | (2006.01) |

(52) U.S. Cl.
CPC ....... *H05K 5/0017* (2013.01); *H01L 51/0097* (2013.01); *H05K 1/028* (2013.01); *H05K 3/0044* (2013.01); *H05K 3/0058* (2013.01); *H05K 2201/09045* (2013.01)

(58) Field of Classification Search
CPC ................. H05K 5/0017; H05K 1/028; H05K 2201/09045
USPC .......................................... 174/254; 361/749
See application file for complete search history.

(56) References Cited

U.S. PATENT DOCUMENTS

| 2016/0043344 A1* | 2/2016 | Shin ..................... H01L 51/5246 257/40 |
| 2016/0174332 A1* | 6/2016 | Shin ....................... H05B 33/14 313/504 |

* cited by examiner

*Primary Examiner* — Sherman Ng
(74) *Attorney, Agent, or Firm* — Harness, Dickey & Pierce, P.L.C.

(57) ABSTRACT

The present disclosure provides a display device and a method for manufacturing the same. The display device includes a first substrate, a second substrate and at least one flexible printed circuit. The first substrate is opposite to the second substrate. A first end of the flexible printed circuit is attached onto at least one side of the first substrate, and a second end of the flexible printed circuit is attached onto the second substrate. A slope structure is arranged at an edge of the first substrate at a side thereof where the first end of the flexible printed circuit is attached.

17 Claims, 5 Drawing Sheets

DISPLAY DEVICE AND METHOD FOR MANUFACTURING THE SAME

CROSS-REFERENCE TO RELATED APPLICATION

This application claims a priority to Chinese Patent Application No. 201610127628.7 filed on Mar. 7, 2016, the disclosures of which are incorporated in their entirety by reference herein.

TECHNICAL FIELD

The present disclosure relates to the field of display technology, and in particular to a display device and a method for manufacturing the same.

BACKGROUND

In the field of electro-optic display, the organic light-emitting diode (OLED) has advantages such as being capable of emitting light actively, being of high brightness, high contrast ratio, ultrathin, low power consumption, flexible and wide operation temperature range, which is an advanced and new display device. In recent years, the OLED display device has been rapidly developed in terms of large size, high contrast ratio and high performance, meanwhile it is expected that the display device may be more thin, of a narrower border, and wearable. Therefore, an ultrathin display device with an ultra-narrow border may be helpful to reducing a size of a terminal product and reducing a weight thereof, and an important way to improve the user's viewing experience.

A driving circuit is arranged in the display device, which may be arranged on a flexible printed circuit (FPC), and the FPC may be fixed onto a packaging cover plate by inversing and binding, thereby narrowing the border of the display device effectively. However, burrs may occur at the right-angled edge of the packaging cover plate, which may stab the FPC, and thus the driving circuit may be damaged.

In the related art, a buffer cushion is generally arranged between the packaging cover plate and the FPC, so as to prevent damaging the driving circuit. However, a cushion attaching process is required, thereby adversely increasing the manufacturing cost, increasing the reject ratio and thickening the display device.

SUMMARY

The present disclosure provides a display device and a method for manufacturing the same, so as to reduce a manufacturing cost, improve a product yield and thin a display device.

To achieve the object of the present disclosure, a display device is provided, including a first substrate, a second substrate and at least one flexible printed circuit. The first substrate is opposite to the second substrate, a first end of the flexible printed circuit is attached onto at least one side of the first substrate, and a second end of the flexible printed circuit is attached onto the second substrate. The first substrate includes a slope structure at an edge of the first substrate at a side thereof where the first end of the flexible printed circuit is attached.

Optionally, there exists at least one slope structure at the at least one side of the first substrate, and a position of each of the at least one slope structure is corresponding to a position of the first end of the flexible printed circuit on the first substrate.

Optionally, there exists a plurality of slope structures at the at least one side of the first substrate, and the slope structures are arranged at intervals.

Optionally, the slope structures are spaced from each other at an identical interval.

Optionally, there exists one slope structure at the at least one side of the first substrate, and the slope structure extends along the entire edge of the first substrate at the at least one side as a whole.

Optionally, the slope structure is a concave slope, a convex slope or a wave-like slope.

Optionally, the slope structure is spaced from the flexible printed circuit.

Optionally, the slope structure is a concave slope concaved towards to an inner portion of the first or the second substrate.

Optionally, the slope structure is of a smooth surface and rounded edges.

Optionally, the flexible printed circuit is spanned across the slope structure.

Optionally, the slope structure surrounds a periphery of the first substrate.

Optionally, the slope structure is a continuous integral structure.

To achieve the object of the present disclosure, a method for manufacturing a display device is provided, including: forming a groove at an edge of a first substrate at at least one side thereof; oppositely arranging the first substrate and a second substrate; cutting the groove to form a slope structure; and attaching a first end of a flexible printed circuit onto the at least one side of the first substrate, and attaching a second end of the flexible printed circuit onto the second substrate.

Optionally, a connection line of the cutting marks is corresponding to a center line of the groove.

Optionally, the step of attaching the first end of the flexible printed circuit onto the at least one side of the first substrate and attaching the second end of the flexible printed circuit onto the second substrate includes: spanning the flexible printed circuit across the slope structure with the first end of the flexible printed circuit attached onto the at least one side of the first substrate and with the second end of the flexible printed circuit attached onto the second substrate.

According to the display device and the method for manufacturing the same provided by the present disclosure, the first end of the flexible printed circuit is attached onto at least one side of the first substrate, the second end of the flexible printed circuit is attached onto the second substrate. The slope structure is arranged at an edge of the first substrate at a side thereof where the first end of the flexible printed circuit is attached. By arranging the edge of the first substrate to be sloped, it is able to protect effectively the flexible printed circuit from being stabbed by the burrs of the square edge of the first substrate without attaching a buffer cushion to the flexible printed circuit, thereby reducing the manufacturing cost, improving the product yield and thinning the display device.

DETAILED DESCRIPTION

In order to make the technical solutions better understood by those skilled in the art, the display device and the method for manufacturing the same in the present disclosure will be described hereinafter in detail in conjunction with the drawings and embodiments.

Figure 1:
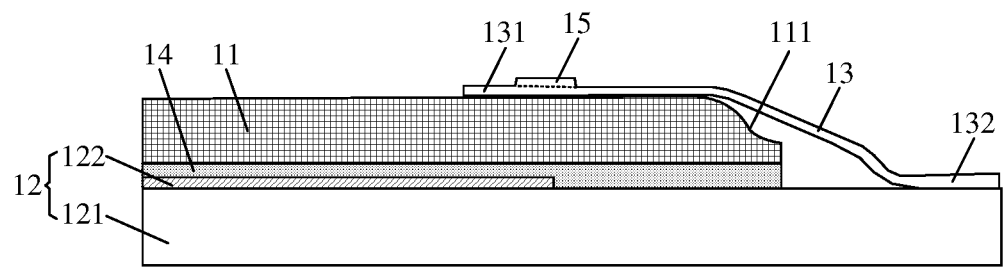
FIG. 1 is a schematic view of a display device in some embodiments of the present disclosure.
Figure 2:
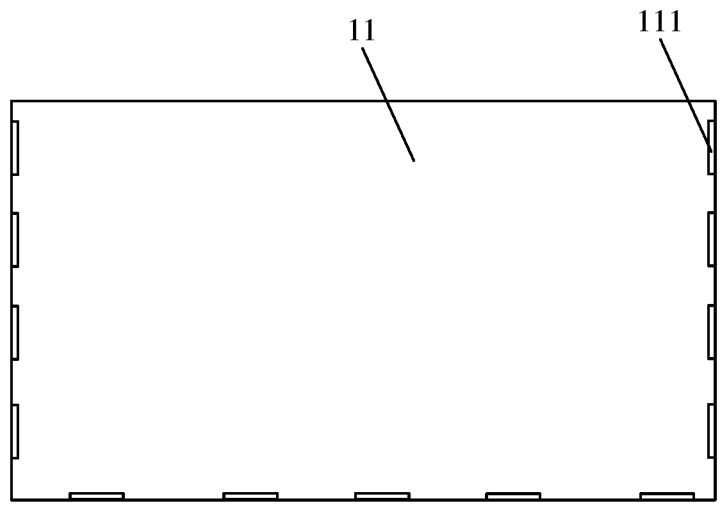
FIG. 2 is a top view of a first substrate shown in FIG. 1.

FIG. 1 is a schematic view of a display device in some embodiments of the present disclosure. FIG. 2 is a top view of a first substrate shown in FIG. 1. As shown in FIGS. 1 and 2, the display device includes: a first substrate 11, a second substrate 12 and at least one flexible printed circuit 13. The first substrate 11 is opposite to the second substrate 12. A first end 131 of the flexible printed circuit 13 is attached onto at least one side of the first substrate 11, and a second end 132 of the flexible printed circuit 13 is attached onto the second substrate 12. A slope structure 111 is arranged at an edge of the first substrate 11 at a side thereof where the first end 131 of the flexible printed circuit 13 is arranged.

It should be noted that, FIG. 1 merely shows a part of the display device.

At one side of the first substrate 11, there is at least one slope structure 111, and a position of each of the at least one slope structure 111 is corresponding to a position of the first end 131 of the flexible printed circuit 13 on the first substrate 11. Optionally, there exists a plurality of slope structures 111 which are arranged at intervals. As shown in FIG. 2, in some embodiments of the present disclosure, the slope structures 111 are arranged at the edges of the first substrate 11 at three sides thereof. There is a plurality of slope structures 111 at each of the three sides of the first substrate 11, and the slope structures 111 are arranged at intervals. For example, at the right edge of the first substrate 11, there are four slope structures 111 arranged at intervals. Optionally, the slope structures 111 are spaced from each other at an identical interval.

From the above, at each side of the substrate 11, the slope structures 111 are arranged at interval, i.e., the slope structures 111 are not continuous. The slope structures 111 are such arranged on the first substrate 11 that the square edge of the first substrate 11 may be removed so as to protect the flexible printed circuit 13 from being stabbed by the burrs of the square edge. Therefore, the position of the slope structure 111 is corresponding to the position of the first end 131 of the flexible printed circuit 13 on the first substrate 11. The number of the slope structures 111 may be corresponding to the number of the flexible printed circuits 13, i.e., the number of the slope structures 111 may be equal to the number of the flexible printed circuits 13. In other words, in some embodiments of the present disclosure, the flexible printed circuits 13 are in one-to-one correspondence to the slope structures 111.

The slope structures 111 may be concave slopes, convex slopes or wave-like slopes. In some embodiments of the present disclosure, as shown in FIG. 1, each of the slope structures 111 may be a concave slope. For example, each of the slope structures 111 may be a concave slope concaved towards to an inner portion of the first or second substrate.

In some embodiments of the present disclosure, the first end 131 of the flexible printed circuit 13 is bound onto a surface of the first substrate 11 away from the second substrate 12, and the second end 132 of the flexible printed circuit 13 is bound onto a surface of the second substrate 12 closed to the first substrate 11. A driving circuit 15 is arranged on the first end 131 of the flexible printed circuit 13.

In some embodiments of the present disclosure, the display device is an OLED display device, the first substrate 11 is a packaging cover plate, and the second substrate 12 is an OLED display substrate. To be specific, the second substrate 12 includes a second base substrate 121 and a light-emitting component 122 arranged on the second base substrate 121. The light-emitting component 122 may be a top light-emitting component or a bottom light-emitting component. In practical application, optionally, the display device may be a liquid crystal display device, then the first substrate 11 may be a color filter substrate, and the second substrate 12 may be an array substrate. Furthermore, the display device further includes a packaging adhesive material 14 configured to packaging the second substrate 12. In practical application, the display device may be a crystal liquid display device, and the detailed description thereof is omitted herein.

In some embodiments of the present disclosure, the packaging may be a dam packaging. In practical application, the packaging may be an inorganic thin film packaging, an organic thin film packaging, an inorganic-and-organic-film stacking packaging, a dam and filler packaging or an area packaging.

In the display device in some embodiments of the present disclosure, the first end of the flexible printed circuit is attached onto at least one side of the first substrate, and the second end of the flexible printed circuit is attached onto the second substrate. The slope structure is arranged at an edge of the first substrate at a side thereof where the first end of the flexible printed circuit is attached. By arranging the edge of the first substrate to be sloped, it is able to protect effectively the flexible printed circuit from being stabbed by the burrs of the square edge of the first substrate without attaching a buffer cushion to the flexible printed circuit, thereby reducing the manufacturing cost, improving the product yield and thinning the display device.

Figure 3:
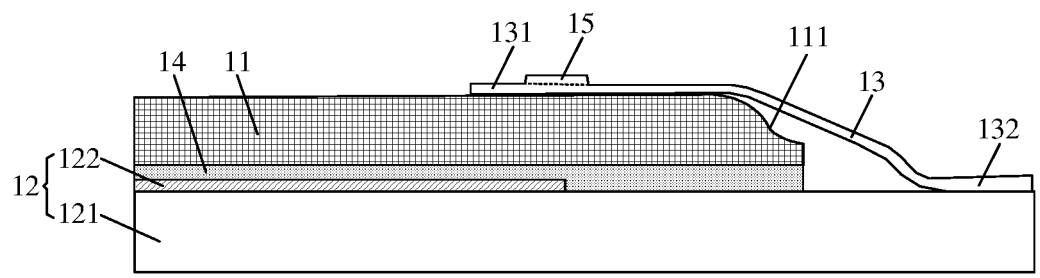
FIG. 3 is a schematic view of a display device in some embodiments of the present disclosure.
Figure 4:
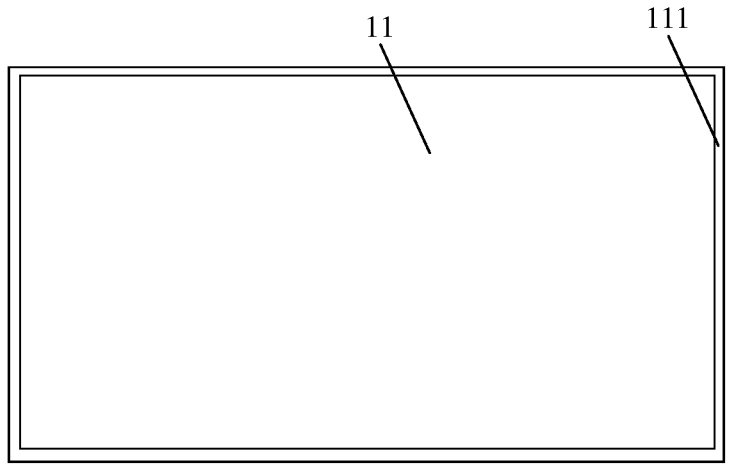
FIG. 4 is a top view of a first substrate shown in FIG. 3.

FIG. 3 is a schematic view of a display device in some embodiments of the present disclosure. FIG. 4 is a top view of a first substrate shown in FIG. 3. As shown in FIGS. 3 and 4, the display device includes: a first substrate 11, a second substrate 12 and at least one flexible printed circuit 13. The first substrate 11 is opposite to the second substrate 12. A first end 131 of the flexible printed circuit 13 is attached onto at least one side of the first substrate 11, and a second end 132 of the flexible printed circuit 13 is attached onto the second substrate 12. A slope structure 111 is arranged at an edge of the first substrate 11 at a side thereof where the first end 131 of the flexible printed circuit 13 is attached. In some embodiments of the present disclosure, the slope structure 111 is spaced from the flexible printed circuit 13, or the flexible printed circuit 13 is spanned across the slope structure 111.

It should be noted that, FIG. 3 merely shows a part of the display device.

There is one slope structure 111 at one side of the first substrate 11, and the slope structure 111 extends along the entire edge of the first substrate at the side as a whole. As shown in FIG. 4, in some embodiments of the present disclosure, the slope structures 111 are arranged at the edges of the first substrate 11 at four sides thereof. At each side of the first substrate 11, the slope structure 111 extends along the entire edge at the side as a whole. In some embodiments of the present disclosure, the slope structures 111 at four edges of the first substrate 11 are connected to each other, so as to form a continuous and integral slope structure at the periphery of the first substrate 11.

From the above, at each side of the substrate 11, the slope structures 111 are continuous, i.e., the slope structures 111 are not arranged at intervals. The slope structures 111 are such arranged on the first substrate 11 that the square edge of the first substrate 11 may be removed so as to protect the flexible printed circuit 13 from being stabbed by the burrs of the square edge, and the slope structures 111 are continuous, therefore the first end 131 of the flexible printed circuit 13 may be arranged at any position of the first substrate 11 as needed. In some embodiments of the present disclosure, the slope structure 111 at one side of the first substrate 11 extends along the entire edge of the first substrate 11 at the side, so the slope structure is easier to be manufactured in compared with the solutions descried hereinabove.

The slope structure 111 may be a concave slope, a convex slope or a wave-like slope. In some embodiments of the present disclosure, as shown in FIG. 3, the slope structure 111 may be a concave slope.

In some embodiments of the present disclosure, the first end 131 of the flexible printed circuit 13 is bound onto a surface of the first substrate 11 away from the second substrate 12, and the second end 132 of the flexible printed circuit 13 is bound onto surface of the second substrate 12 closed to the first substrate 11. A driving circuit 15 is arranged on the first end 131 of the flexible printed circuit 13.

In some embodiments of the present disclosure, the display device is an OLED display device, the first substrate 11 is a packaging cover plate, and the second substrate 12 is an OLED display substrate. To be specific, the second substrate 12 includes a second base substrate 121 and a light-emitting component 122 arranged on the second base substrate 121. The light-emitting component 122 may be a top light-emitting component or a bottom light-emitting component. In practical application, optionally, the display device may be a liquid crystal display device, then the first substrate 11 may be a color filter substrate, and the second substrate 12 may be an array substrate. Furthermore, the display device further includes a packaging adhesive material 14 configured to packaging the second substrate 12. In practical application, the display device may also be a crystal liquid display device, and the detailed description thereof is omitted herein.

In some embodiments of the present disclosure, the packaging may be a dam packaging. In practical application, the packaging may be an inorganic thin film packaging, an organic thin film packaging, an inorganic and organic film stacking packaging, a dam and filler packaging or an area packaging.

In the display device in some embodiments of the present disclosure, the first end of the flexible printed circuit is attached onto at least one side of the first substrate, and the second end of the flexible printed circuit is attached onto the second substrate. The slope structure is arranged at an edge of the first substrate at a side thereof where the first end of the flexible printed circuit is attached. By arranging the edge of the first substrate to be sloped, it is able to protect effectively the flexible printed circuit from being stabbed by the burrs of the square edge of the first substrate without attaching a buffer cushion to the flexible printed circuit, thereby reducing the manufacturing cost, improving the product yield and thinning the display device.

Figure 5:
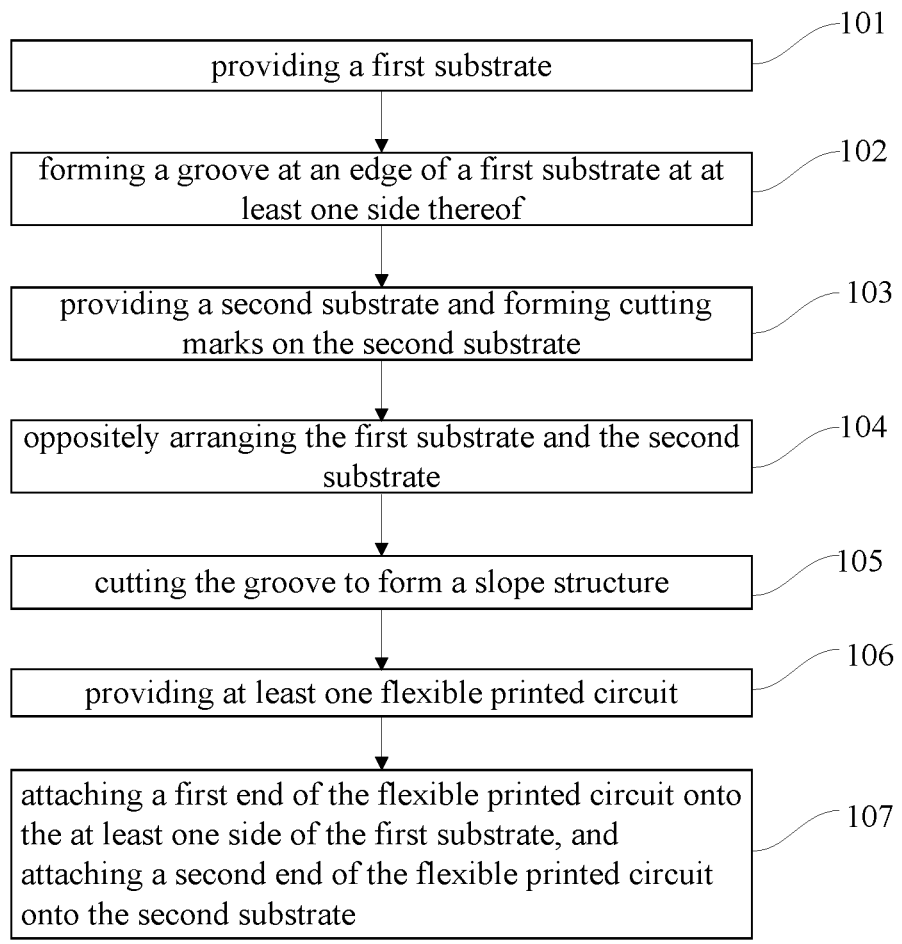
FIG. 5 is a flow chart of a method for manufacturing a display device in some embodiments of the present disclosure.

FIG. 5 is a flow chart of a method for manufacturing a display device in some embodiments of the present disclosure. As shown in FIG. 5, the method includes following steps 101-107.

Step 101 is to provide a first substrate.

Figure 6A:
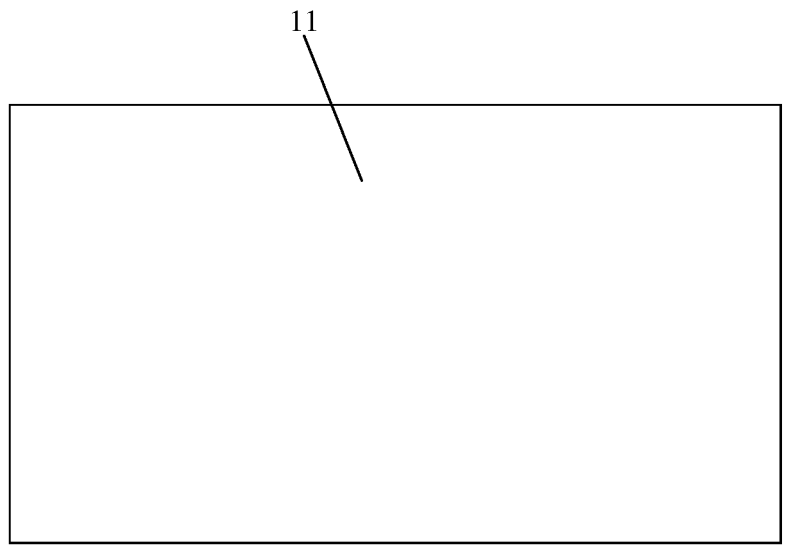
FIG. 6a is a schematic view of a first substrate in a manufacturing process shown in FIG. 5.

FIG. 6a is a schematic view of the first substrate formed in Step 101. The first substrate 11 is formed as shown in FIG. 6a.

Step 102 is to form a groove at an edge of a first substrate at at least one side thereof.

Figure 6B:
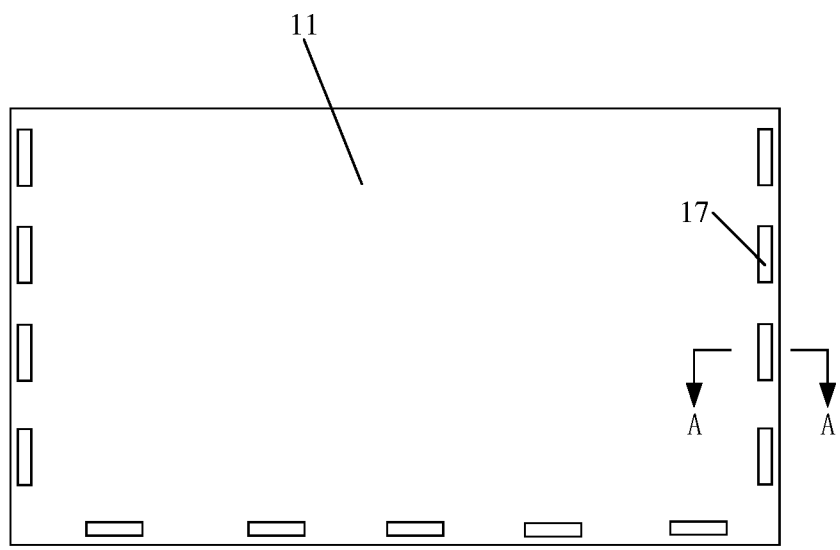
FIG. 6b is a schematic view of a groove in a manufacturing process shown in FIG. 5.
Figure 6C:
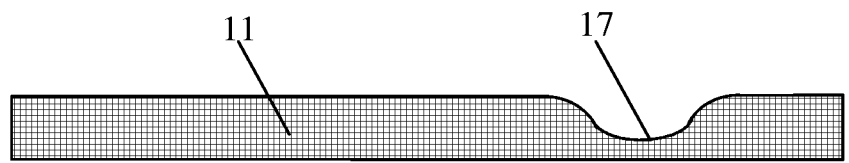
FIG. 6c is a sectional view of the structure in FIG. 6b taken along a line A-A.

FIG. 6b is a schematic view of a groove formed in Step 102. FIG. 6c is a sectional view of the structure along a line A-A in FIG. 6b. As shown in FIGS. 6b and 6c, the grooves 17 are formed at the edges of the first substrate 11. FIGS. 6b and 6c are the formed components of the display device shown in FIGS. 1 and 2.

Figure 6D:
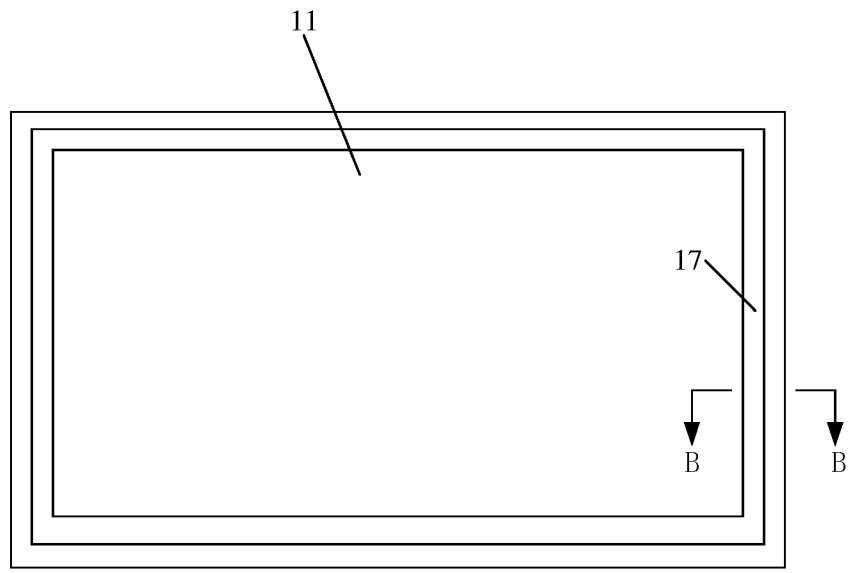
FIG. 6d is a schematic view of another groove in a manufacturing process shown in FIG. 5.
Figure 6E:
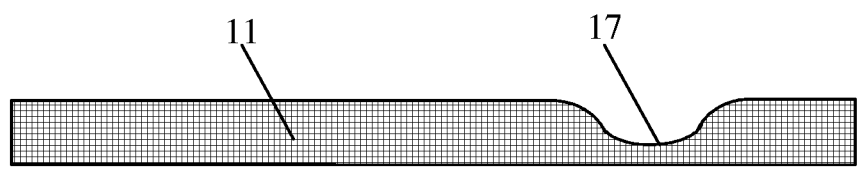
FIG. 6e is a sectional view of the structure in FIG. 6d taken along a line B-B.

FIG. 6d is a schematic view of another groove formed in Step 102. FIG. 6e is a sectional view of the structure along a line B-B in FIG. 6d. As shown in FIGS. 6d and 6e, the groove 17 is formed at the edges of the first substrate 17 as a whole. FIGS. 6b and 6c are the formed components of the display device shown in FIGS. 3 and 4.

Step 103 is to provide a second substrate and form cutting marks in the second substrate.

Figure 6F:
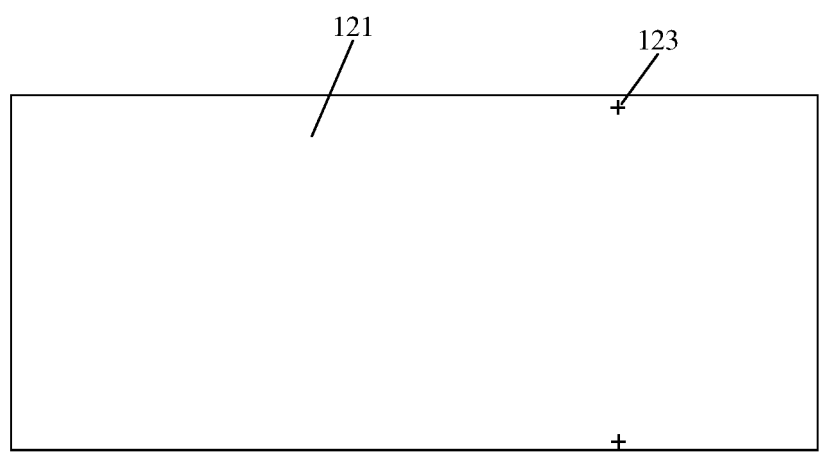
FIG. 6f is a schematic view of cutting marks in a second substrate in a manufacturing process shown in FIG. 5.

FIG. 6f is a schematic view of the cutting marks formed in Step 103 in the second substrate. As shown in FIG. 6f, the cutting marks 123 are formed in the second substrate 121, and a connection line of the cutting marks 123 is corresponding to the groove in the first substrate. Optionally, the connection line of the cutting marks 123 is corresponding to a center line of the groove. In some embodiments of the present disclosure, merely two cutting marks 123 are formed in the second substrate 121, and the connection line of the two cutting marks 123 may not be formed actually. It should be noted that, only the second base substrate 121 of the second substrate is shown, and only a part of the second base substrate 121 is shown.

Step 104 is to oppositely arrange the first substrate and the second substrate.

Figure 6G:
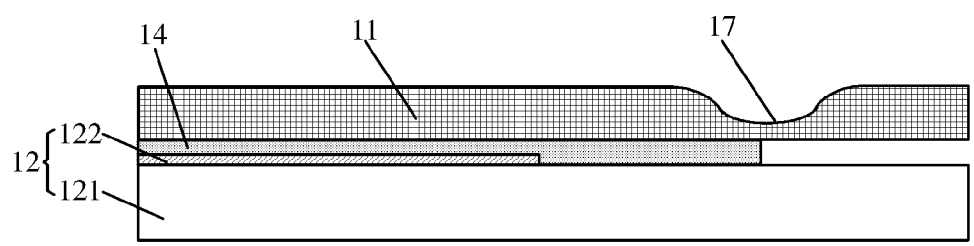
FIG. 6g is a schematic view of a first substrate and a second substrate oppositely arranged to each other in a manufacturing process shown in FIG. 5.

FIG. 6g is a schematic view of a structure formed by oppositely arranging the first substrate and the second substrate in Step 104. As shown in FIG. 6g, a packaging adhesive material 14 is coated onto the light-emitting component 122 of the second substrate 12, and then first substrate 11 is bonded to the packaging adhesive material 14, so as to oppositely arrange the first substrate 11 and the second substrate 12. The connection line of the cutting marks in the second substrate 12 is corresponding to the groove 17. Optionally, the connection line of the cutting marks is corresponding to a center line of the groove 17.

Step 105 is to cut the groove to form a slope structure.

Step 105 further includes cutting the groove along the connection line of the cutting marks to form the slope structure. To be specific, the cutting is performed from one cutting mark 123 to the other cutting mark 123, i.e., the cutting is performed along the connection line of the two cutting marks 123.

Figure 6H:
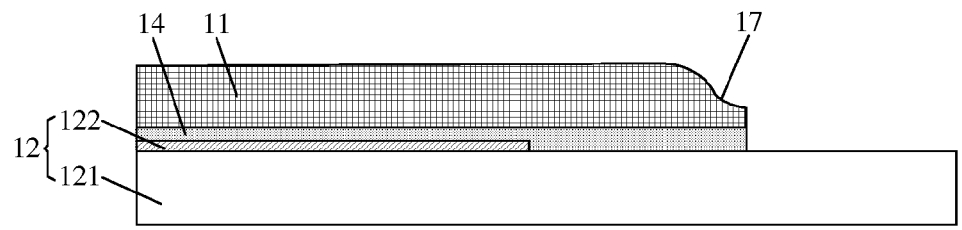
FIG. 6h is a schematic view of a slope structure in a manufacturing process shown in FIG. 5.

FIG. 6h is a schematic view of a slope structure formed in Step 105. As shown in FIG. 6h, the groove 17 is cut along the connection line of the cutting marks 123 so as to form the slope structure 111. The resultant slope structure is of a smooth surface and rounded edges.

Step 106 is to provide at least one flexible printed circuit.

Step 107 is to attach a first end of the flexible printed circuit onto the at least one side of the first substrate, and attach a second end of the flexible printed circuit onto the second substrate.

As shown in FIGS. 1 and 3, the first end 131 of the flexible printed circuit 13 is attached onto the at least one side of the first substrate 11, and the second end 132 of the flexible printed circuit 13 is attached onto the second substrate 12.

The display device in the embodiments hereinabove may be manufactured by the method for manufacturing the display device in some embodiments of the present disclosure.

According to the method for manufacturing display devices in some embodiments of the present disclosure, the first end of the flexible printed circuit is attached onto at least one side of the first substrate, the second end of the flexible printed circuit is attached onto the second substrate. The slope structure is arranged at an edge of the first substrate at a side thereof where the first end of the flexible printed circuit is attached. By arranging the edge of the first substrate to be sloped, it is able to protect effectively the flexible printed circuit from being stabbed by the burrs of the square edge of the first substrate without attaching a buffer cushion to the flexible printed circuit, thereby reducing the manufacturing cost, improving the product yield and thinning the display device.

The above are merely the preferred embodiments of the present disclosure. A person skilled in the art may make further modifications and improvements without departing from the principle of the present disclosure, and these modifications and improvements shall also fall within the scope of the present disclosure.

What is claimed is:

1. A display device, comprising: a first substrate; a second substrate; and at least one flexible printed circuit; wherein the first substrate is opposite to the second substrate, a first end of the flexible printed circuit is attached onto at least one side of the first substrate, and a second end of the flexible printed circuit is attached onto the second substrate; the first substrate comprises a slope structure at an edge of the first substrate at a side thereof where the first end of the flexible printed circuit is attached, the first substrate further comprising a plurality of slope structures at the at least one side of the first substrate, and the slope structures are arranged at intervals.

2. The display device according to claim 1, wherein there exists at least one slope structure at the at least one side of the first substrate, and a position of each of the at least one slope structure is corresponding to a position of the first end of the flexible printed circuit on the first substrate.

3. The display device according to claim 1, wherein the slope structures are spaced from each other at an identical interval.

4. The display device according to claim 1, wherein there exists one slope structure at the at least one side of the first substrate, and the slope structure extends along the entire edge of the first substrate at the at least one side as a whole.

5. The display device according to claim 1, wherein the slope structure is a concave slope, a convex slope or a wave-like slope.

6. The display device according to claim 1, wherein the slope structure is spaced from the flexible printed circuit.

7. The display device according to claim 6, wherein the slope structure is a concave slope concaved towards to an inner portion of the first substrate or the second substrate.

8. The display device according to claim 6, wherein the slope structure is of a smooth surface and rounded edges.

9. The display device according to claim 1, wherein the flexible printed circuit is spanned across the slope structure.

10. The display device according to claim 9, wherein the slope structure is a concave slope concaved towards to an inner portion of the first substrate or the second substrate.

11. The display device according to claim 9, wherein the slope structure is of a smooth surface and rounded edges.

12. The display device according to claim 1, wherein the slope structure surrounds a periphery of the first substrate.

13. The display device according to claim 12, wherein the slope structure is a continuous integral structure.

14. A method for manufacturing a display device, comprising: forming a groove at an edge of a first substrate at least one side thereof; oppositely arranging the first substrate and a second substrate; cutting the groove to form a slope structure; and attaching a first end of a flexible printed circuit onto the at least one side of the first substrate where the slope structure is formed, and attaching a second end of the flexible printed circuit onto the second substrate, the first substrate further comprising a plurality of slope structures at the at least one side of the first substrate, and the slope structures are arranged at intervals.

15. The method according to claim 14, wherein prior to the step of oppositely arranging the first substrate and the second substrate, the method further comprises: forming cutting marks in the second substrate in such a manner that a connection line of the cutting marks is corresponding to the groove; wherein the step of cutting the groove to form the slope structure comprises: cutting the groove along the connection line of the cutting marks to form the slope structure.

16. The method according to claim 15, wherein the connection line of the cutting marks is corresponding to a center line of the groove.

17. The method according to claim 14, wherein the step of attaching the first end of the flexible printed circuit onto the at least one side of the first substrate and attaching the second end of the flexible printed circuit onto the second substrate comprises: spanning the flexible printed circuit across the slope structure with the first end of the flexible printed circuit attached onto the at least one side of the first substrate and with the second end of the flexible printed circuit attached onto the second substrate.

* * * * *